United States Patent
Lee et al.

(10) Patent No.: US 6,743,678 B2
(45) Date of Patent: Jun. 1, 2004

(54) METHODS FOR MANUFACTURING SEMICONDUCTOR MEMORY DEVICES

(75) Inventors: Kwang-hee Lee, Seoul (KR); Sung-tae Kim, Seoul (KR); Cha-young Yoo, Kyungki-do (KR); Han-jin Lim, Seoul (KR); Wan-don Kim, Kyungki-do (KR); Se-hoon Oh, Chungcheongnam-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/424,959

(22) Filed: Apr. 28, 2003

(65) Prior Publication Data

US 2004/0087085 A1 May 6, 2004

(30) Foreign Application Priority Data

Nov. 4, 2002 (KR) ................................ 10-2002-0067744

(51) Int. Cl.[7] ............................................. H01L 21/336
(52) U.S. Cl. ...................................................... 438/257
(58) Field of Search ........................................... 438/257

(56) References Cited

U.S. PATENT DOCUMENTS

| | | | | |
|---|---|---|---|---|
| 5,622,888 A | * | 4/1997 | Sekine et al. | 438/398 |
| 5,708,302 A | * | 1/1998 | Azuma et al. | 257/751 |
| 5,790,366 A | * | 8/1998 | Desu et al. | 361/305 |
| 6,218,238 B1 | * | 4/2001 | Huang et al. | 438/253 |

* cited by examiner

*Primary Examiner*—David Nelms
*Assistant Examiner*—Thao P. Le
(74) *Attorney, Agent, or Firm*—Myers Bigel Sibley & Sajovec

(57) ABSTRACT

A lower electrode is formed from a first metal on a semiconductor substrate. Atoms of a second metal, that is different than the first metal, are diffused into the lower electrode. A dielectric layer is formed on the lower electrode, and an upper electrode is formed on the dielectric layer. Diffusion of second metal atoms into the lower electrode may reduce or prevent crystal grain growth and agglomeration on a surface of the lower electrode during a subsequent high temperature process.

26 Claims, 11 Drawing Sheets

METHODS FOR MANUFACTURING SEMICONDUCTOR MEMORY DEVICES

RELATED APPLICATION

This application claims priority from Korean Patent Application No. 2002-0067744, filed Nov. 4, 2002, the disclosure of which is hereby incorporated herein by reference in its entirety as if set forth fully herein.

FIELD OF THE INVENTION

The present invention relates to a method for manufacturing a semiconductor memory device, and more particularly, to a method for manufacturing a metal-insulating layer-metal (MIM) capacitor.

BACKGROUND OF THE INVENTION

As the integration density of semiconductor devices has increased, the available area for devices has decreased. With less available area, capacitors that are used for storing information in a DRAM may need to provide an equivalent or greater capacitance in less area. Some approaches for reducing capacitor area include, forming a lower electrode of a capacitor in a three-dimensional shape, such as a cylinder or a fin, increasing a surface area of the lower electrode by covering it with a hemispherical grain, reducing the thickness of a capacitor dielectric layer, and using a high k-dielectric material or a ferroelectric material as a dielectric layer.

When high k-dielectric materials, such as $Ta_2O_5$ or BST ($(Ba,Sr)TiO_3$), are used for a dielectric layer, polysilicon may not be useful as a capacitor electrode because of tunneling that may occur through the dielectric layer and a resulting leakage current. For this reason, noble metals having a very high work function, such as platinum (Pt), ruthenium (Ru), iridium (Ir), rhodium (Rh), and osmium (Os), are often used for capacitor electrodes when a dielectric layer is formed from high k-dielectric materials or ferroelectric materials. Ruthenium, which may be etched by a plasma containing oxygen, is widely used for electrodes of metal-insulating layer-metal (MIM) capacitors.

FIG. 1 is a cross-sectional view of an MIM capacitor using ruthenium for a lower electrode. An interlayer dielectric layer (ILD) 15 is formed on a semiconductor substrate 10. A contact plug 20 is formed in the ILD 15. The contact plug 20 may be a material, such as titanium nitride (TiN), which does not react with a later formed ruthenium lower electrode. A mold oxide layer (not shown) is deposited to a predetermined thickness on the ILD 15. A predetermined portion of the mold oxide layer is etched to expose the contact plug 20 and to form a region on which a lower electrode can be formed (not shown).

A lower electrode material is deposited on the mold oxide layer. The mold oxide layer is exposed using chemical mechanical polishing (CMP) or an etchback process to form a concave-type lower electrode 25. The mold oxide layer is then removed.

A tantalum oxide ($Ta_2O_5$) layer 30 is formed on the lower electrode 25 and the ILD 15 to serve as a dielectric layer. A thermal process is applied to the tantalum oxide layer 30 at a temperature of 600 to 700° C. to improve its dielectric characteristics. An upper electrode 35, such as ruthenium, is formed on the tantalum oxide layer 30 to provide the capacitor 40.

When the high-temperature thermal process is applied to the tantalum oxide layer 30, an agglomeration may occur from a growth of crystal grains on a surface of the ruthenium lower electrode 25. Such crystal grain growth and the agglomeration on the surface of the upper electrode 35 may occur even if the high-temperature thermal process occurs after the upper electrode 35 is formed.

FIG. 2A illustrates an SEM photograph after a ruthenium lower electrode is deposited, and FIG. 2B illustrates an SEM photograph after a high-temperature thermal process is applied to the tantalum oxide layer 30. Referring to FIG. 2A, the ruthenium metal layer (the lower electrode) has a uniform surface immediately after the deposition. However, after a predetermined temperature is applied during the thermal process, the surface of the lower electrode 25 experiences crystal grain grown and agglomeration as shown in FIG. 2B. As shown in FIG. 2B, the surface of the lower electrode 25 becomes non-uniform due to the agglomeration. Additionally, the agglomeration may cause the thickness of the dielectric layer, i.e., the tantalum oxide layer 30 to be changed. Moreover, the agglomeration may cause adhesion of the lower electrode 25 to the tantalum oxide layer 30 to be degraded and may result in generation of a leakage current.

SUMMARY OF THE INVENTION

Embodiments of the present invention provide methods for manufacturing semiconductor memory devices. According to some embodiments, a lower electrode is formed from a first metal on a semiconductor substrate. Atoms of a second metal, that is different than the first metal, are diffused into the lower electrode. A dielectric layer is formed on the lower electrode, and an upper electrode is formed on the dielectric layer.

According to other embodiments of the present invention, a first metal layer of a first metal is deposited on a semiconductor substrate. A second metal layer of a second metal, that is different than the first metal, is deposited on the first metal layer. A third metal layer of the first metal is deposited on the second metal layer opposite to the first metal layer. The third metal layer, the second metal layer, and the first metal layer are thermally treated to diffuse atoms from the second metal layer into the first and third metal layers and to form a lower electrode. A dielectric layer is formed on the lower electrode, and an upper electrode is formed on the dielectric layer.

According to other embodiments of the present invention, a first metal and a second metal are simultaneously deposited on a semiconductor substrate to form a lower electrode. A dielectric layer is formed on the lower electrode, and an upper electrode is formed on the dielectric layer.

According to other embodiments of the present invention, a lower electrode of a first metal is formed on a semiconductor substrate. Ions of a second metal are implanted into the lower electrode. The lower electrode is thermally treated to diffuse the implanted ions of the second metal into the lower electrode. A dielectric layer is formed on the lower electrode, and an upper electrode is formed on the dielectric layer.

According to yet other embodiments of the present invention, a lower electrode is formed on a semiconductor substrate. A dielectric layer is formed on the lower electrode. An upper electrode of a first metal is formed on the dielectric layer. Atoms of a second metal that is different than the first metal are diffused into the upper electrode.

Forming the lower electrode and/or the upper electrode from a first metal with diffused second metal may reduce or prevent crystal grain growth and agglomeration during a subsequent high temperature process. Accordingly, a dielectric layer formed on the electrode may have a more uniform thickness, and leakage current may be reduced.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
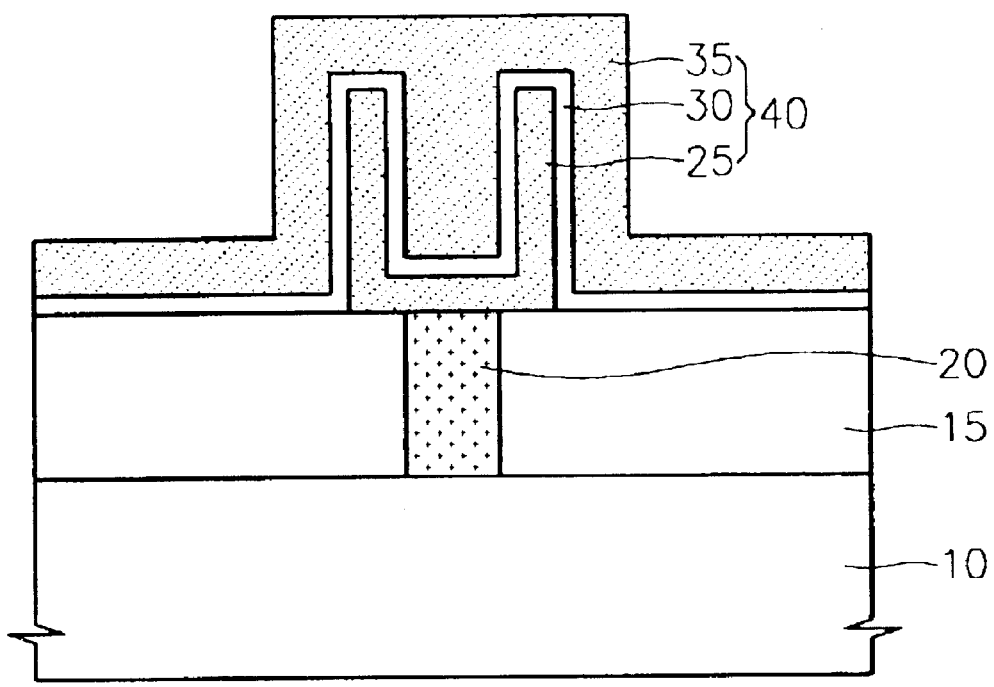
FIG. 1 is a cross-sectional view of an MIM capacitor using ruthenium for a lower electrode.

The present invention will now be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the shape and thickness of elements are exaggerated for clarity, and the same reference numerals in different drawings represent the same element. It will also be understood that when an element, such as a layer, a substrate, or the like, is referred to as being "on" another element, it can be directly on the other element, or intervening elements may also be present.

Embodiment 1

Figure 3A:
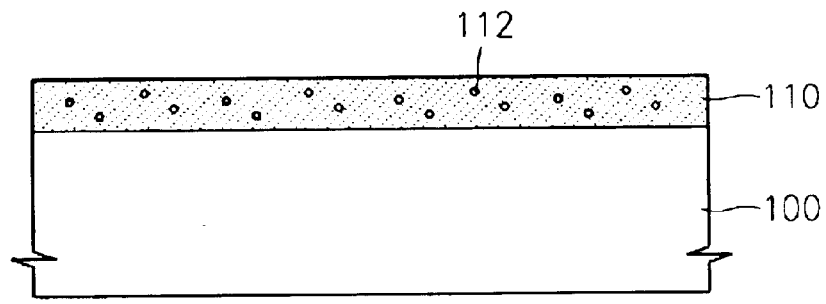
FIGS. 3A through 3C are schematic cross-sectional views illustrating a method for manufacturing a semiconductor memory device according to a first embodiment of the present invention.
Figure 3B:
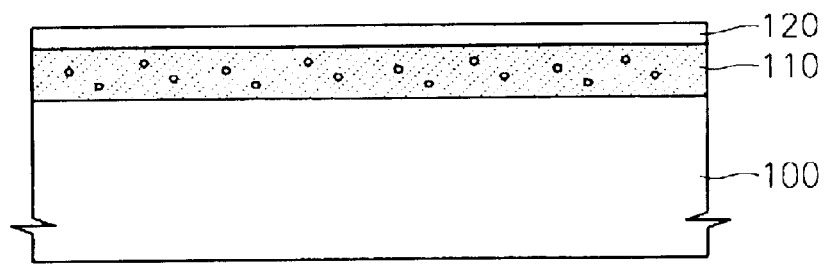
Figure 3C:
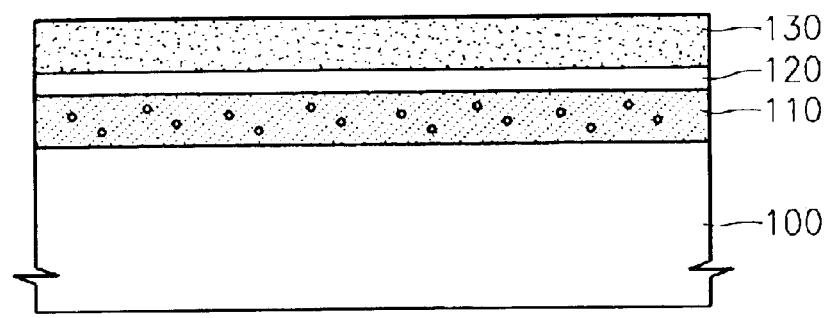
Figure 4:
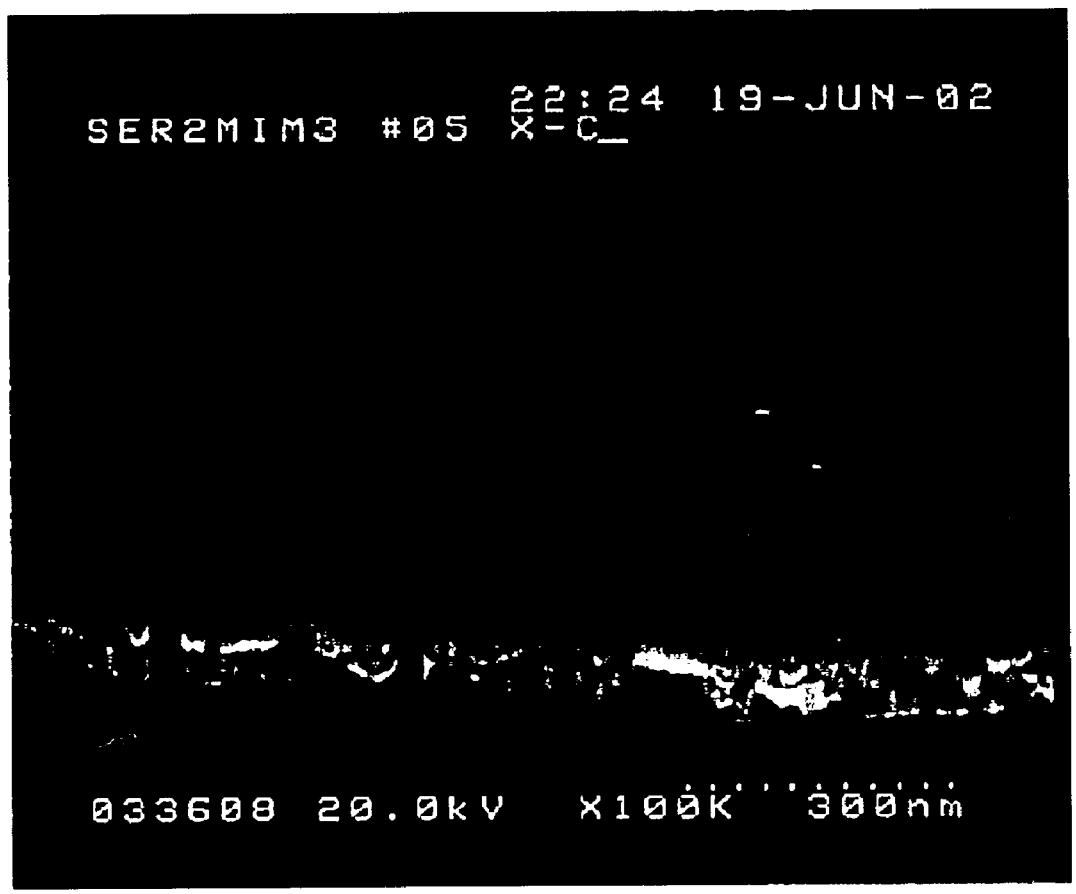
FIG. 4 is an SEM photograph showing a surface of a lower electrode after a high-temperature thermal process.

FIGS. 3A through 3C are schematic cross-sectional views that illustrate a method for manufacturing a semiconductor memory device according to a first embodiment of the present invention. FIG. 4 is an SEM photograph showing a surface of a lower electrode after a high-temperature thermal process.

Referring to FIG. 3A, a lower electrode layer 110 is deposited on a semiconductor substrate 100. The lower electrode layer 110 may be comprise a noble metal, such as ruthenium. Metal atoms 112 that are different from the lower electrode layer 110 are diffused into the lower electrode layer 110. The metal atoms 112 may be diffused, for example, by depositing a sacrificial metal layer on the lower electrode layer 110, heat treating the layers to diffuse metal atoms from the sacrificial metal layer into the lower electrode layer 110, and removing the sacrificial metal layer. Consequently, the lower electrode layer 110 becomes an alloy of at least two kinds of metals. The diffused metal atoms 112 may be a noble metal or a transition metal, such as titanium, and which may be selected based on cost. The diffused metal atoms 112 combine with the lower electrode layer 110 atoms (e.g., ruthenium atoms) to restrain atom movement, and which may thereby reduce or prevent crystal grain growth and agglomeration during a subsequent heating process.

Referring to FIG. 3B, a tantalum oxide layer 120 may be formed as a dielectric layer on the lower electrode layer 110. The tantalum oxide layer 120 may be deposited after performing a stabilization process. A thermal process may be performed at a temperature of 600 to 700° C. to cure the tantalum oxide layer 120. Although a high-temperature is applied to the lower electrode layer 110, its metal alloy may reduce or prevent crystal grain growth and agglomeration.

Referring to FIG. 3C, an upper electrode layer 130 is formed on the tantalum oxide layer 120. The upper electrode layer 130 may be, for example, a ruthenium layer.

Figure 2A:
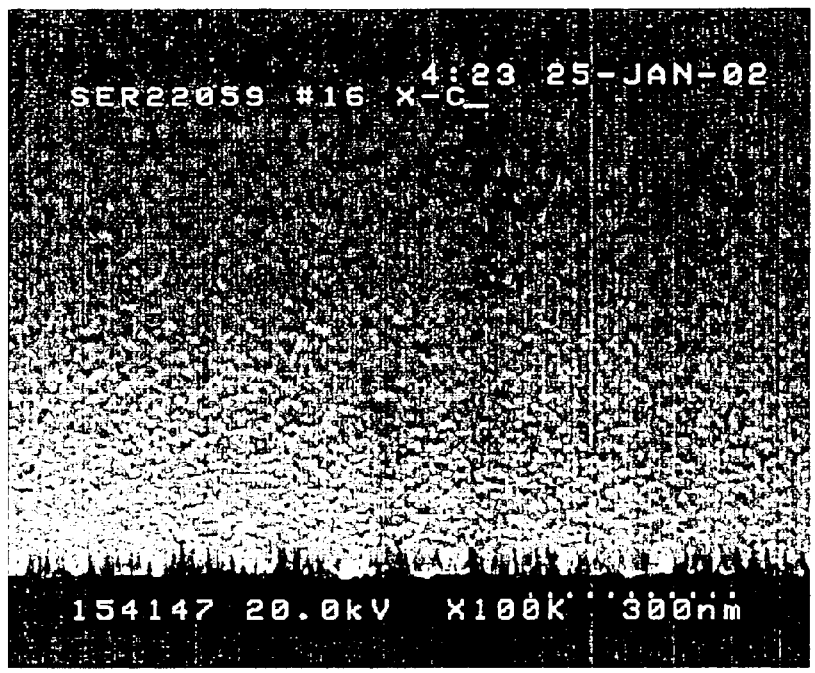
FIG. 2A is an SEM photograph immediately after depositing the ruthenium lower electrode.
Figure 2B:
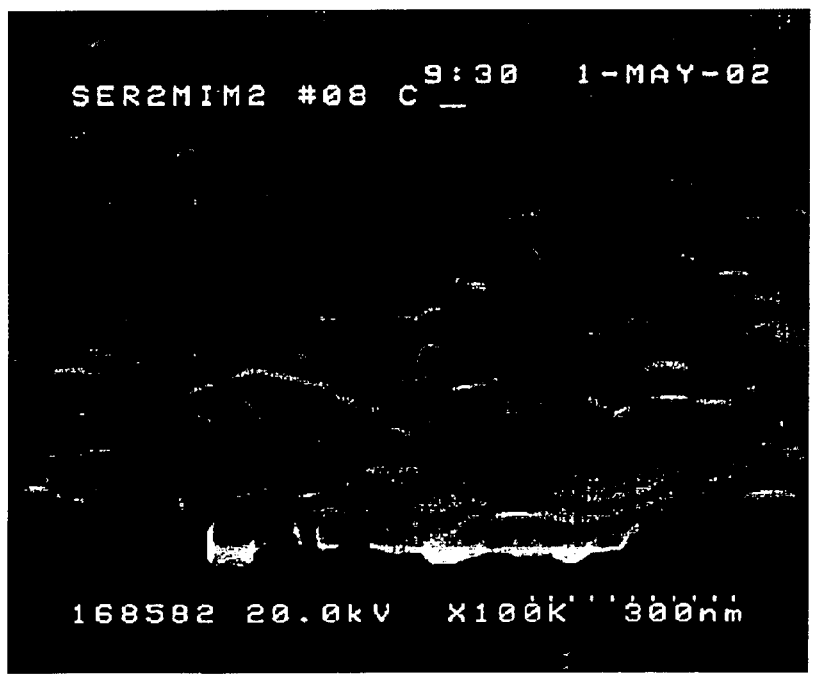
FIG. 2B is an SEM photograph after thermally treating a tantalum oxide layer.

FIG. 4 is an SEM photograph of a lower electrode according to the present embodiment after a thermal process has been performed to a tantalum oxide layer on the lower electrode. Referring to FIG. 4, metal atoms, which are different from the metal atoms of the lower electrode layer, have been diffused into the lower electrode layer. As shown in FIG. 4, the diffused metal atoms have substantially reduced crystal grain growth on a surface of the lower electrode layer, as compared with a surface of the lower electrode layer that is shown in FIG. 2.

Embodiment 2

Figure 5A:
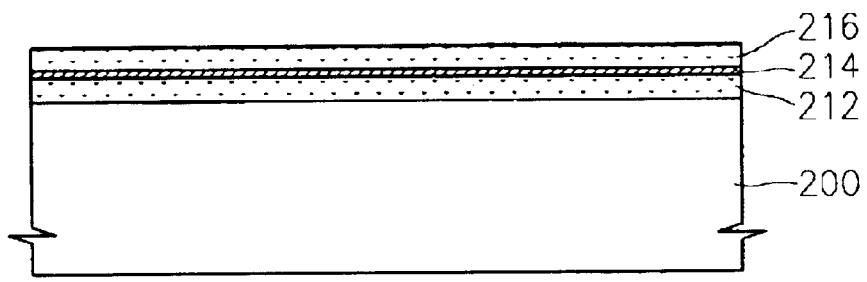
FIGS. 5A through 5C are schematic cross-sectional views illustrating a method for manufacturing a semiconductor memory device according to a second embodiment of the present invention.
Figure 5B:
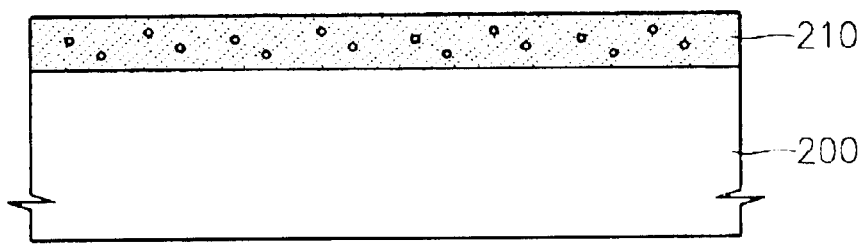
Figure 5C:
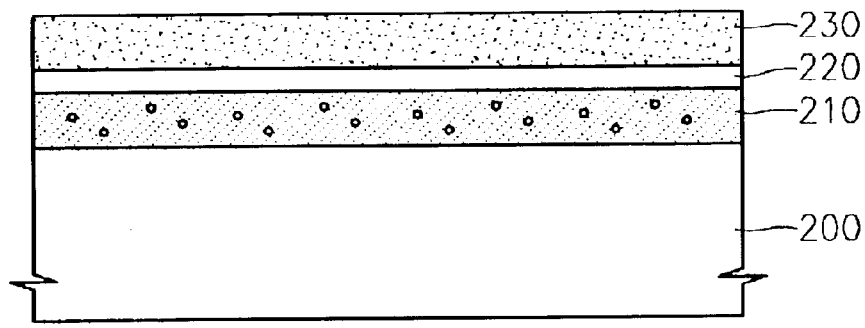

FIGS. 5A through 5C are schematic cross-sectional views that illustrate a semiconductor memory device according to a second embodiment of the present invention.

As illustrated in FIG. 5A, a first metal layer 212 is deposited on a semiconductor substrate 200. The first metal layer 212 may be thinner than a desired predetermined thickness of a lower electrode. Another metal layer 214 that is a different type of metal than the first metal layer 212 is deposited on the first metal layer 212. The different-type of metal layer 214 may comprise a noble metal such as platinum or a transition metal such as titanium. The different-type of metal layer 214 may be formed to a have a thickness of about 5 to 15% of the thickness of the first metal layer 212. A second metal layer 216 may be deposited on the different-type of metal layer 214. The first and second metal layers 212 and 216 may be the same type of metal, for example, ruthenium.

As illustrated in FIG. 5B, the first metal layer 212, the different-type of metal layer 214, and the second metal layer 216 may be thermally treated at a predetermined temperature to diffuse sufficient atoms of the different-type of metal layer 214 into the first and second metal layers 212 and 216. The thermal treatment may include a first thermal process in a hydrogen (H$_2$) atmosphere at about 450° C., followed by a second thermal process in a nitrogen (N$_2$) atmosphere at about 700° C. The resulting lower electrode layer 210 is an alloy formed by the diffusion of atoms from the different-type metal layer 214 into the first and second metal layers 212 and 216.

Referring to FIG. 5C, a tantalum oxide layer 220 may be formed as a dielectric layer on the lower electrode layer 210 with a similar process to that described for the first embodiment. An upper electrode layer 230 may be formed on the tantalum oxide layer 220. The upper electrode layer 230 may be, for example, a ruthenium layer.

Embodiment 3

Figure 6A:
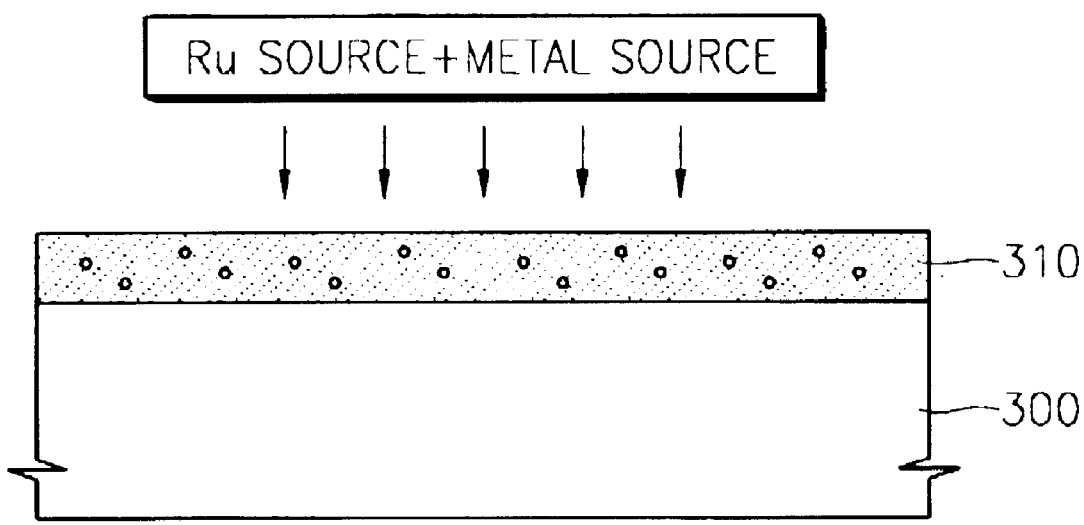
FIGS. 6A and 6B are schematic cross-sectional views illustrating a method for manufacturing a semiconductor memory device according to a third embodiment of the present invention.
Figure 6B:
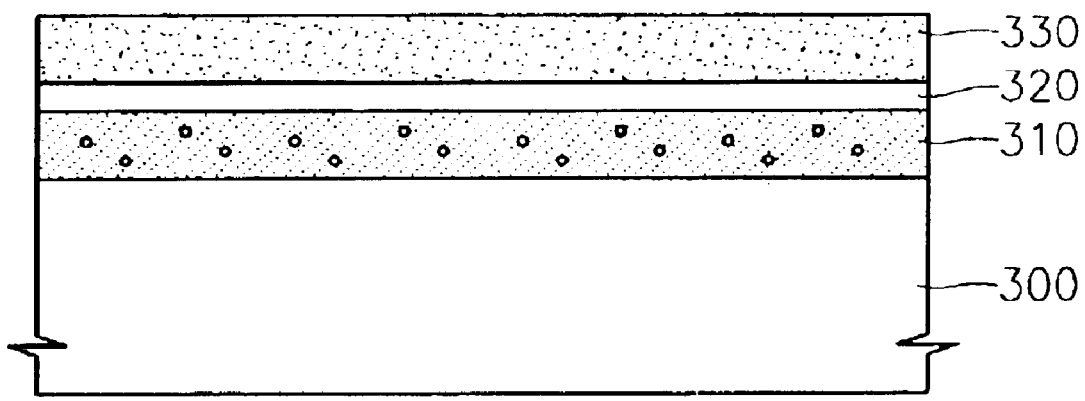

FIGS. 6A and 6B are schematic cross-sectional views that illustrate a semiconductor memory device according to a third embodiment of the present invention.

Referring to FIG. 6A, two different types of metal are simultaneously deposited, for example, by chemical vapor deposition (CVD), on a surface of a semiconductor substrate 300 to form lower electrode layer 310. The two different types of metal may be supplied by different metal sources. The lower electrode layer 310 may be deposited in a gas atmosphere containing oxygen. A first one of the metal sources for the lower electrode 310 may be a gas containing a noble metal, for example, ruthenium. A second metal source for the lower electrode 310 may be a gas containing a different type of noble metal, for example, platinum, or a transition metal such as titanium. The second metal source may be supplied at a lower rate and/or volume than the first metal source for the lower electrode 310.

When the two metal sources are simultaneously deposited to form the lower electrode layer 310, the second type of metal or metal oxide may be uniformly distributed in the lower electrode layer 310. When the first one of the metal sources of the lower electrode layer 310 is ruthenium, the presence of distributed oxides in the lower electrode layer 310 may not affect the conductivity of the lower electrode layer 310.

As illustrated in FIG. 6B, a tantalum oxide layer 320 may be formed on the lower electrode layer 310 by the same method as for the first or second embodiment. An upper electrode 330 may be formed on the tantalum oxide layer 320.

Embodiment 4

Figure 7A:
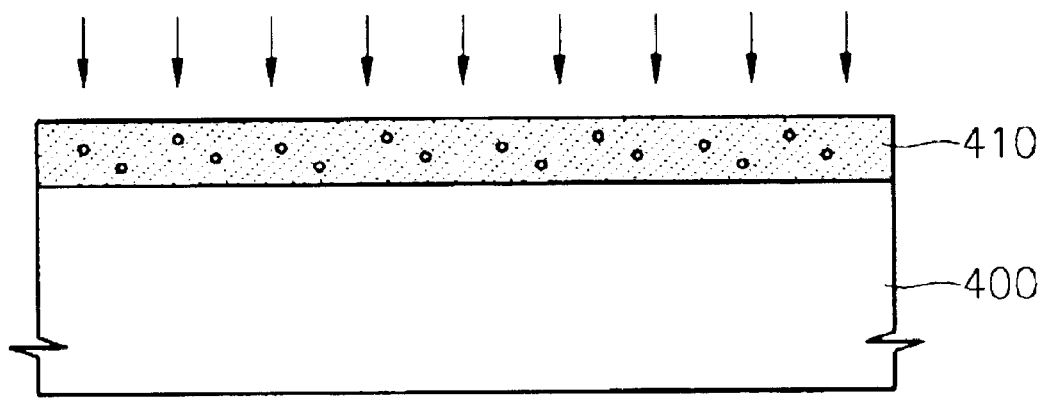
FIGS. 7A and 7B are schematic cross-sectional views illustrating a method for manufacturing a semiconductor memory device according to a fourth embodiment of the present invention.
Figure 7B:
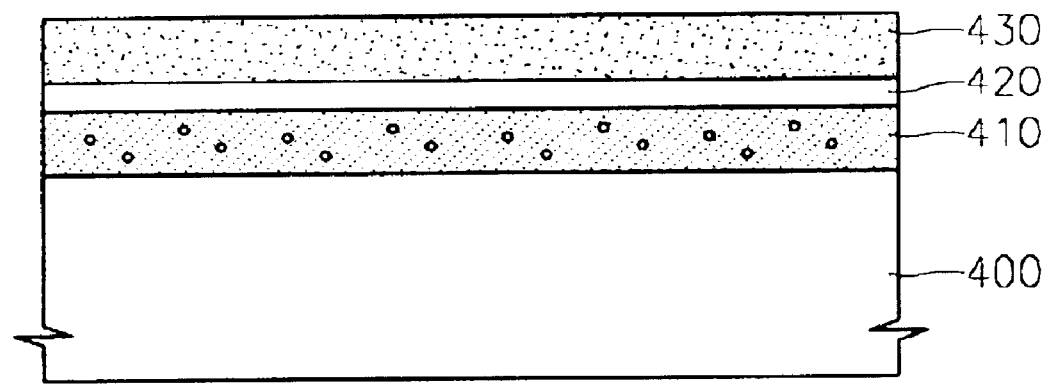

FIGS. 7A and 7B are schematic cross-sectional views that illustrate a semiconductor memory device according to a fourth embodiment of the present invention.

Referring to FIG. 7A, a lower electrode layer 410 is deposited on a semiconductor substrate 400. The lower electrode layer 410 may be ruthenium. A metal that is a different type than that of the lower electrode layer 410, for example, platinum or titanium, is ion implanted into the lower electrode layer 410 to form an alloy of two or more metals.

As illustrated in FIG. 7B, a thermal process may be applied to the lower electrode layer 410 to activate, or distribute, the implanted metal ions in the lower electrode layer 410. A tantalum oxide layer 420, for use as a dielectric layer, and an upper electrode layer 430 may be deposited on the lower electrode layer 410. In this manner, a different type of metal may be implanted and diffused into the deposited lower electrode layer 410.

Embodiment 5

FIGS. 8A through 8D are cross-sectional views that illustrate a method for manufacturing a semiconductor memory device according to a fifth embodiment of the present invention.

Figure 8A:
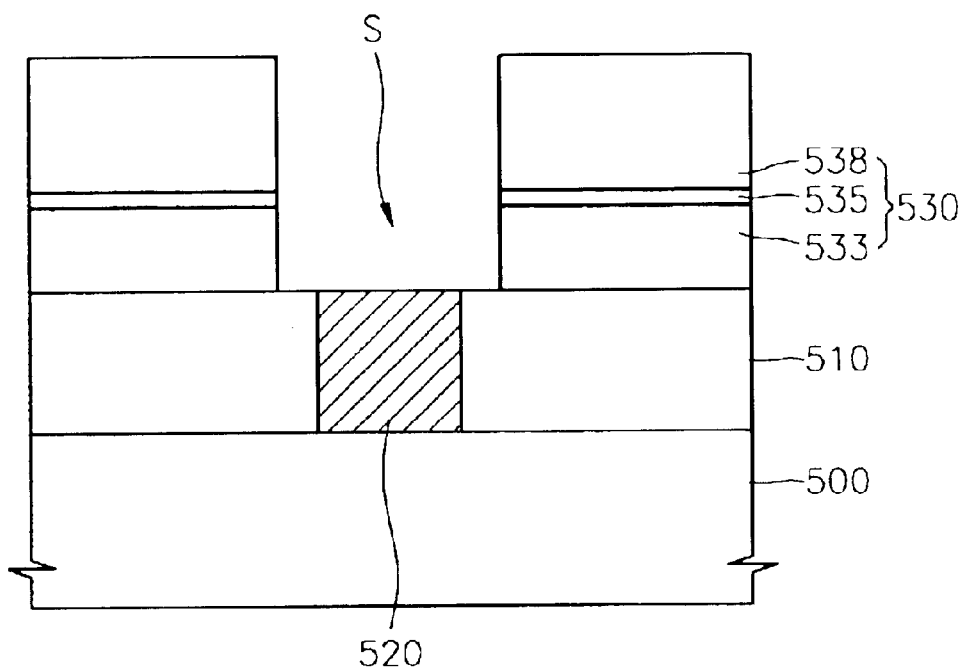
FIGS. 8A through 8D are cross-sectional views illustrating a method for manufacturing a semiconductor memory device according to a fifth embodiment of the present invention.

Referring to FIG. 8A, an interlayer dielectric layer (ILD) 510 is deposited on a semiconductor substrate 500. Although not shown in the drawings, a MOS transistor including a gate, source, and drain as well as a bit line contacting the drain may be formed between the semiconductor substrate 500 and the ILD 510. A storage node contact plug 520, which is electrically connected with the source, may be formed in the ILD 510 by a conventional process. The storage node contact plug 520 may be, for example, titanium nitride.

A mold oxide layer 530 may be formed on the ILD 510 and the storage node contact plug 520. The mold oxide layer 530 may include a first insulating layer 533, an etch stopper 535, and a second insulating layer 538. The thickness of the mold oxide layer 530 may define the height of a later formed lower electrode. The first and second insulating layers 533 and 538 may be a silicon oxide, and the etch stopper 535 may be silicon nitride or another material that has a different etch selectivity from that of the silicon oxide. The mold oxide layer 530 may be etched until a predetermined portion of the storage node contact plug 520 is exposed to define a lower electrode region S.

Figure 8B:
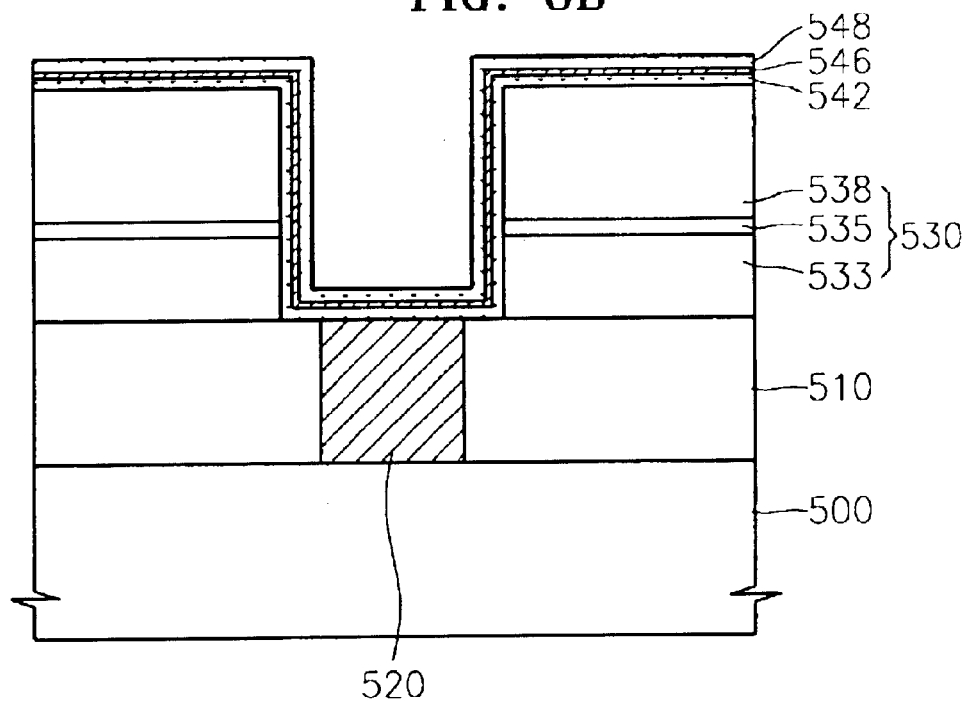

Referring to FIG. 8B, a first ruthenium layer 542, a titanium layer 546, and a second ruthenium layer 548 may be sequentially stacked on the lower electrode region S and the mold oxide layer 530. The total thickness of the first ruthenium layer 542, the titanium layer 546, and the second ruthenium layer 548 may be adjusted to be equivalent to a desired predetermined thickness of a lower electrode. In some embodiments, a concave-type (or cylindrical-type) lower electrode may be formed and the first and/or second ruthenium layers 542 and/or 548 may be formed to have a thickness of, for example, about 150 to about 300 Å.

Figure 8C:
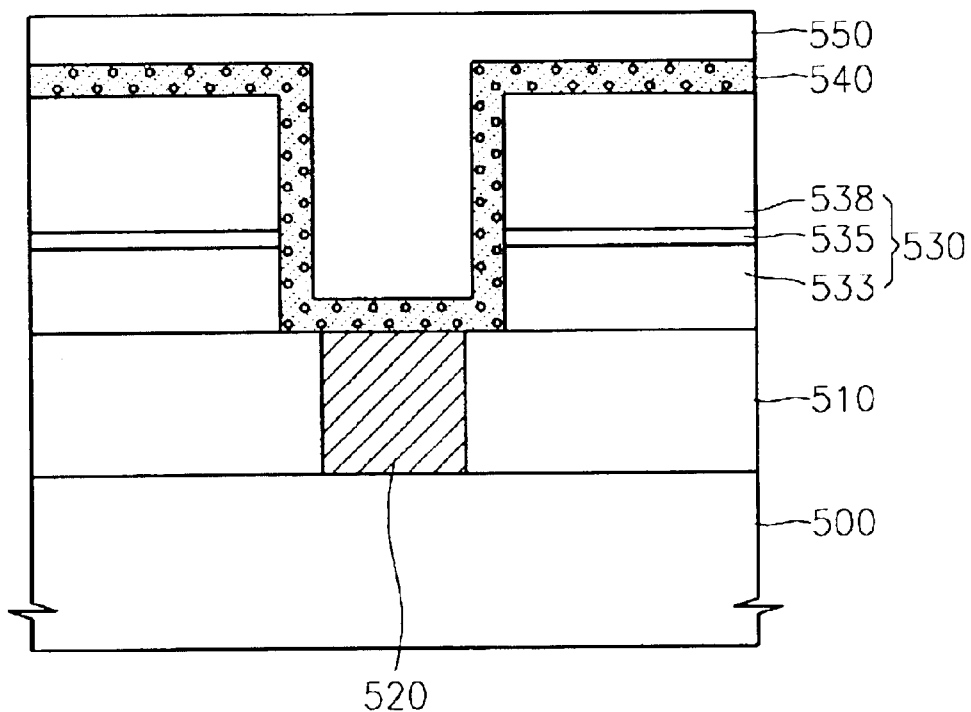

As illustrated in FIG. 8C, a thermal process may be performed to combine, or alloy, the first ruthenium layer 542, the titanium layer 546, and the second ruthenium layer 548. The thermal process may include a first thermal process performed in a hydrogen atmosphere at about 450° C., and a second thermal process in a nitrogen atmosphere at about 700° C. As a result of the thermal process, the ruthenium layer may be alloyed with titanium (with the titanium diffused into the ruthenium layer) to form a ruthenium-titanium alloy layer 540. A sacrificial layer 550 may then be formed having relatively large thickness on the ruthenium-titanium alloy layer 540. The sacrificial layer 550 may be used as a polishing buffer layer for polishing the ruthenium-titanium alloy layer 540, to form a lower electrode, and may be sufficiently thick to fill the lower electrode region S.

Figure 8D:
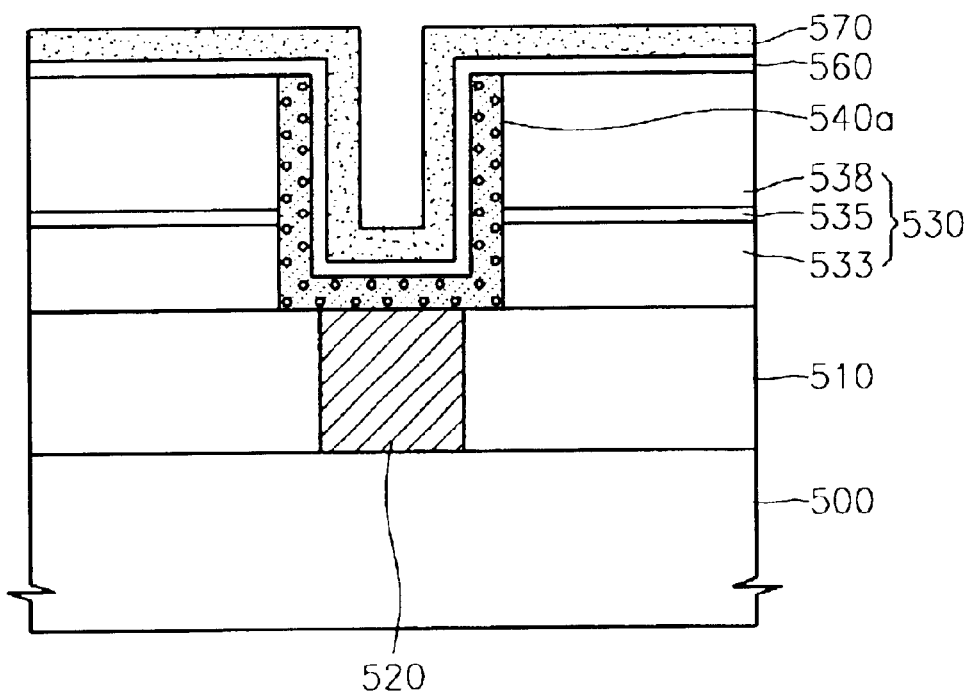

Referring to FIG. 8D, the sacrificial layer 550 and the ruthenium-titanium alloy layer 540 may be polished by, for example, CMP so that the ruthenium-titanium alloy layer 540 is only in the lower electrode region S, and to define a lower electrode 540a. The remnant sacrificial layer 550 may then be removed. A tantalum oxide layer 560 may be formed as a dielectric layer on a surface of the lower electrode 540a and on the mold oxide layer 530. As described above, the tantalum oxide layer 560 may be formed by performing a stabilization process, followed by depositing the tantalum oxide, and a high-temperature (about 600 to about 700° C.) thermal process to improve a dielectric constant of the tantalum oxide layer 560. Although the thermal process for improving the dielectric constant is conducted at a high temperature, the combination of the ruthenium atoms and titanium atoms in the lower electrode 540a may reduce or prevent growth of crystal grains and associated agglomeration. An upper electrode 570 may be formed from ruthenium on the tantalum oxide layer 560.

Embodiment 6

Figure 9A:
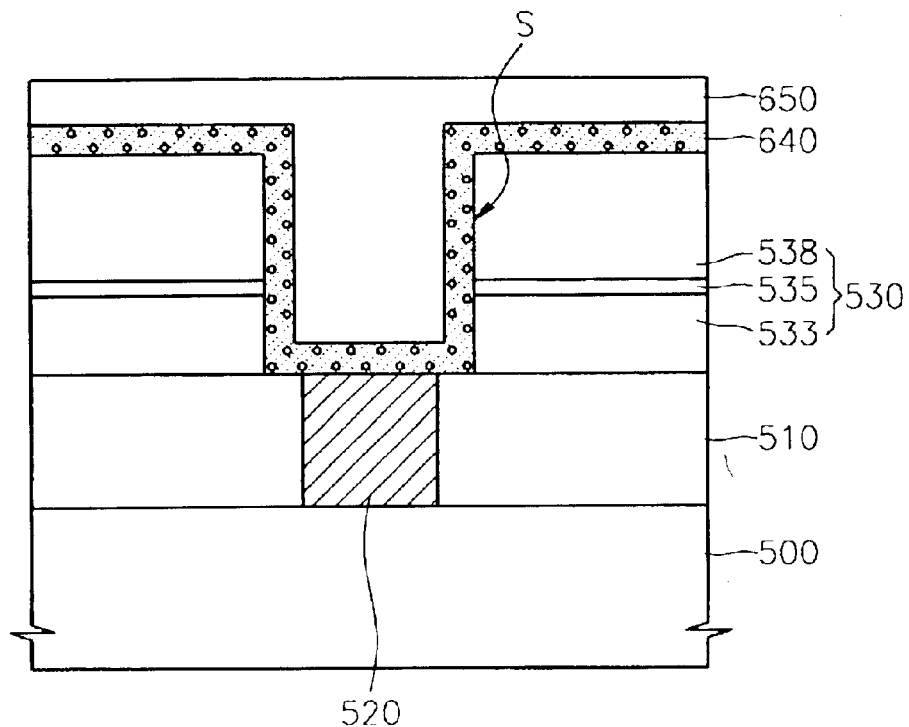
FIGS. 9A and 9B are cross-sectional views illustrating a method for manufacturing a semiconductor memory device according to a sixth embodiment of the present invention.
Figure 9B:
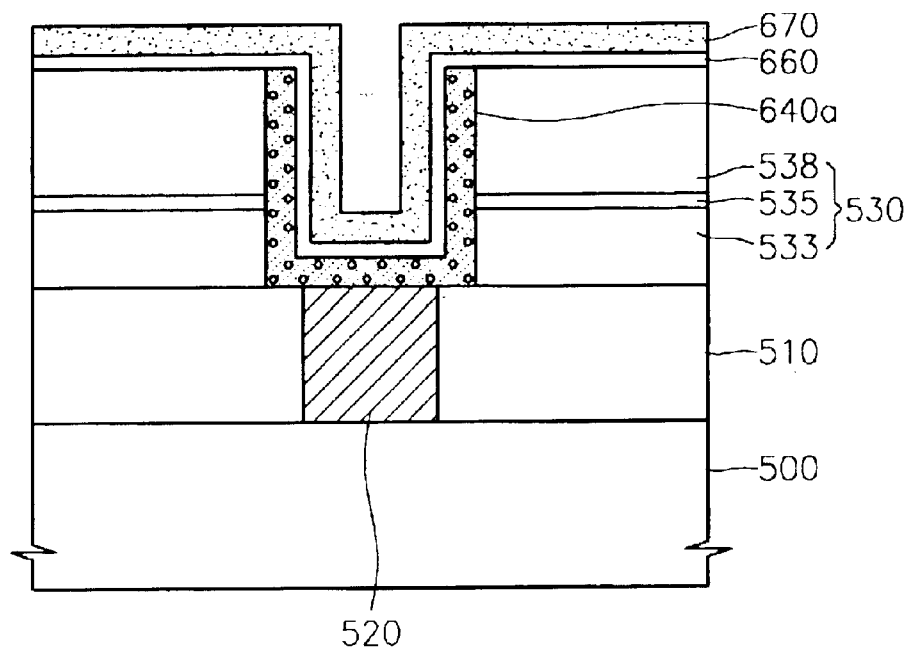

FIGS. 9A and 9B are cross-sectional views that illustrate a method for manufacturing a semiconductor memory device according to a sixth embodiment of the present invention. The manufacturing process that is illustrated in FIG. 9A may be the same as that described with regard to FIG. 8A for the fifth embodiment, and will not be repeated here for brevity.

As illustrated in FIG. 9A, a nuthenium-titanium layer 640 serving as a lower electrode may be deposited by CVD on a surface of the lower electrode region S and the mold oxide layer 530. The CVD process may be performed by simultaneously supplying a ruthenium source and a titanium source in an oxygen atmosphere. The resulting ruthenium-titanium layer 640 includes titanium distributed in the ruthenium. Thereafter, a sacrificial layer 650 may be formed on the ruthenium-titanium layer (or the titanium oxide layer 640). The lower electrode 640 may alternatively be titanium oxide formed on a surface of the lower electrode region S and the mold oxide layer 530, and a sacrificial layer 650 may be formed on the titanium oxide lower electrode 640.

As illustrated in FIG. 9B, the sacrificial layer 650 and the ruthenium-titanium layer 640 may be polished using CMP to define a lower electrode 640a. The remnant sacrificial layer 650 may be removed by a conventional process and a tantalum oxide layer 660 and an upper electrode 670 may then be formed on the resultant structure.

Embodiment 7

Figure 10:
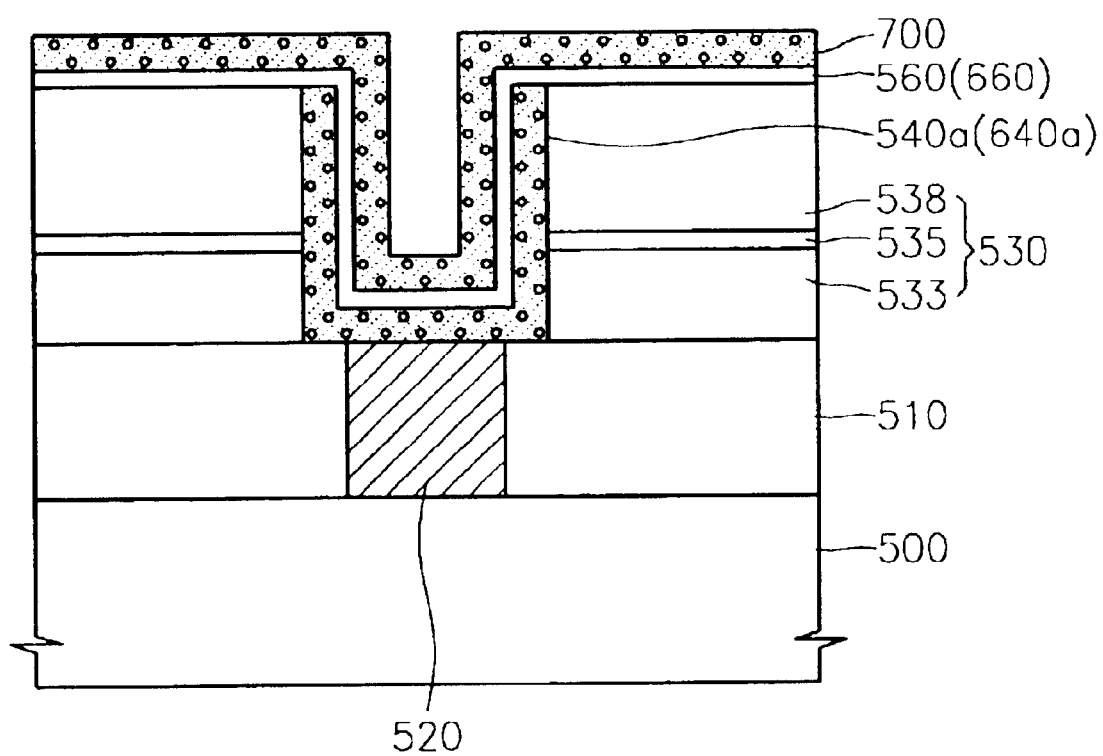
FIG. 10 is a cross-sectional view illustrating a method for manufacturing a semiconductor memory device according to a seventh embodiment of the present invention.

FIG. 10 is a cross-sectional view of a semiconductor memory device that illustrates a seventh embodiment of the present invention. The manufacturing steps of the seventh embodiment may be the same as those described for the fifth and sixth embodiments, except for the process for forming an upper electrode.

Referring to FIG. 10, an upper electrode layer 700 is formed on the tantalum oxide layer 560 or 660. The upper electrode layer 700 may be, for example, a ruthenium layer diffused with titanium. A titanium diffused ruthenium layer may be formed by stacking a ruthenium layer, a titanium layer, and a ruthenium layer and then applying a thermal process with sufficient heat to diffuse the titanium atoms into the ruthenium layers. Alternatively, a titanium diffused ruthenium layer may be formed using CVD in which a ruthenium source and a titanium source are supplied in an atmosphere of oxygen-containing gas. By forming the upper electrode 700 from a titanium diffused ruthenium layer, growth of crystal grains and associated agglomeration may be reduced or prevented during subsequent thermal processes.

As described above, a capacitor may have a lower electrode and/or upper electrode that includes a metal layer in which another type of metal is diffused. Forming a lower electrode and/or upper electrode with a diffused alloy of two metals may in this manner reduce or prevent growth of crystal grains and associated agglomeration during subsequent thermal processes. As a result, the surface of the lower electrode and/or upper electrode may be more uniform and a dielectric layer formed thereon may have a more uniform thickness.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method for manufacturing a semiconductor memory device, the method comprising:
   providing a semiconductor substrate;
   forming a lower electrode of a first metal on the semiconductor substrate;
   diffusing atoms of a second metal into the lower electrode, wherein the second metal is different than the first metal;
   forming a dielectric layer on the lower electrode; and
   forming an upper electrode on the dielectric layer.

2. The method as claimed in claim 1, wherein:
   forming a lower electrode comprises depositing a first metal layer of the first metal on the substrate, and depositing a second metal layer of the second metal on the first metal layer, and depositing a third metal layer of the first metal on the second metal layer opposite to the first metal layer, wherein the first metal is different than the second metal; and
   diffusing atoms of a second metal into the lower electrode comprises thermally treating the third metal layer, the second metal layer, and the first metal layer to diffuse atoms from the second metal layer into the first and third metal layers.

3. The method as claimed in claim 1, wherein forming a lower electrode comprises simultaneously depositing the first metal and the second metal on a surface of the semiconductor substrate by chemical vapor deposition.

4. The method as claimed in claim 3, wherein the chemical vapor deposition is carried out in an atmosphere of oxygen-containing gas.

5. The method as claimed in claim 1, wherein:
   forming a lower electrode comprises depositing a first metal layer of the first metal on the substrate, implanting ions of the second metal into the first metal layer; and
   diffusing atoms of a second metal into the lower electrode comprises activating the ions of the second metal implanted in the first metal layer.

6. The method as claimed in claim 1, wherein the first metal is a noble metal.

7. The method as claimed in claim 6, wherein the noble metal is ruthenium.

8. The method as claimed in claim 6, wherein the second metal is one of a noble metal and a transition metal.

9. The method as claimed in claim 6, wherein the second metal is one of platinum and titanium.

10. A method for manufacturing a semiconductor memory device, the method comprising:
    providing a semiconductor substrate;
    depositing a first metal layer of a first metal on the semiconductor substrate;
    depositing a second metal layer of a second metal on the first metal layer, wherein the first metal is different from the second metal;

depositing a third metal layer of the first metal on the second metal layer opposite to the first metal layer;

thermally treating the third metal layer, the second metal layer, and the first metal layer to diffuse atoms from the second metal layer into the first and third metal layers and to form a lower electrode;

forming a dielectric layer on the lower electrode; and forming an upper electrode on the dielectric layer.

11. The method as claimed in claim 10, wherein the first and third metal layers are noble metals.

12. The method as claimed in claim 11, wherein the first and third metal layers are ruthenium.

13. The method as claimed in claim 10, wherein the second metal layer is one of a noble metal and a transition metal.

14. The method as claimed in claim 10, wherein the second metal layer is one of platinum and titanium.

15. A method for manufacturing a semiconductor memory device, the method comprising:

providing a semiconductor substrate;

depositing a first metal and a second metal on a surface of the semiconductor substrate to form a lower electrode, wherein the first metal and the second metal are deposited simultaneously, and wherein the first metal is different than the second metal;

forming a dielectric layer on the lower electrode; and forming an upper electrode on the dielectric layer.

16. The method as claimed in claim 15, wherein depositing a first metal and a second metal comprises depositing the first and second metals by chemical vapor deposition.

17. The method as claimed in claim 16, wherein the first and second metals are deposited in an atmosphere of oxygen-containing gas.

18. The method as claimed in claim 15, wherein the first metal comprises a noble metal.

19. The method as claimed in claim 18, wherein the first metal comprises ruthenium.

20. The method as claimed in claim 15, wherein the second metal source comprises one of a noble metal and a transition metal.

21. The method as claimed in claim 15, wherein the second metal source comprises one of platinum and titanium.

22. A method for manufacturing a semiconductor memory device, the method comprising:

providing a semiconductor substrate;

forming a lower electrode of a first metal on the semiconductor substrate;

implanting ions of a second metal into the lower electrode, wherein the second metal is different than the first metal;

thermally treating the lower electrode to diffuse the implanted ions of the second metal into the lower electrode;

forming a dielectric layer on the lower electrode; and forming an upper electrode on the dielectric layer.

23. A method for manufacturing a semiconductor memory device, the method comprising:

providing a semiconductor substrate;

forming a lower electrode on the semiconductor substrate;

forming a dielectric layer on the lower electrode;

forming an upper electrode of a first metal on the dielectric layer; and diffusing atoms of a second metal into the upper electrode, wherein the second metal is different than the first metal.

24. The method as claimed in claim 23, wherein:

forming an upper electrode comprises depositing a first metal layer of the first metal on the dielectric layer, and depositing a second metal layer of the second metal on the first metal layer, and depositing a third metal layer of the first metal on the second metal layer opposite to the first metal layer, wherein the first metal is different than the second metal; and diffusing atoms of a second metal into the upper electrode comprises thermally treating the third metal layer, the second metal layer, and the first metal layer to diffuse atoms from the second metal layer into the first and third metal layers.

25. The method as claimed in claim 23, wherein forming an upper electrode comprises simultaneously depositing the first metal and the second metal on a surface of the dielectric layer by chemical vapor deposition.

26. The method as claimed in claim 23, wherein:

forming an upper electrode comprises depositing a first metal layer of the first metal on the dielectric layer, implanting ions of the second metal into the first metal layer; and diffusing atoms of a second metal into the upper electrode comprises activating the ions of the second metal implanted in the first metal layer.

* * * * *